(12) United States Patent
Lee et al.

(10) Patent No.: US 7,382,677 B2
(45) Date of Patent: Jun. 3, 2008

(54) MEMORY DEVICE HAVING INTERNAL VOLTAGE SUPPLY PROVIDING IMPROVED POWER EFFICIENCY DURING ACTIVE MODE OF MEMORY OPERATION

(75) Inventors: Kang Seol Lee, Seoul (KR); Kee Teok Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/544,284

(22) Filed: Oct. 6, 2006

(65) Prior Publication Data

US 2007/0086249 A1  Apr. 19, 2007

(30) Foreign Application Priority Data

Oct. 6, 2005  (KR) .................... 10-2005-0093755

(51) Int. Cl.
*G11C 7/00* (2006.01)
(52) U.S. Cl. ..................... 365/226; 365/196
(58) Field of Classification Search ............... 365/226, 365/196
See application file for complete search history.

(56) References Cited

U.S. PATENT DOCUMENTS

2002/0126561 A1* 9/2002 Roohparvar ............... 365/226
2003/0035325 A1* 2/2003 Kim et al. ............. 365/189.09
2003/0043678 A1* 3/2003 Lovett et al. ............... 365/226
2003/0151967 A1* 8/2003 Nagai et al. ................ 365/226
2005/0111274 A1* 5/2005 Han ........................... 365/203
2005/0122819 A1* 6/2005 Park et al. .................. 365/226
2005/0141316 A1* 6/2005 Ahn et al. .................. 365/226
2005/0141318 A1* 6/2005 Lee ............................ 365/226

FOREIGN PATENT DOCUMENTS

KR  10-1996-0042736  12/1996

\* cited by examiner

*Primary Examiner*—Michael T Tran
(74) *Attorney, Agent, or Firm*—Ladas & Parry LLP (57) ABSTRACT

A internal voltage generator in a semiconductor memory device has a first and second internal voltage generators. The first internal voltage generator outputs a first signal having a first voltage level to internal circuits of the memory device during an active mode of the memory device operation. The second internal voltage generator outputs a second signal having a second voltage level to the internal circuits of the memory device; however, the second signal is interrupted in absence of a predetermined level of a power control signal during the active mode of the memory device operation. The internal voltage control unit monitors the operational signals generated by the memory device and outputs the predetermined level of the power control signal during a plurality of active sections of the active mode of the memory device operation requiring power.

13 Claims, 6 Drawing Sheets

MEMORY DEVICE HAVING INTERNAL VOLTAGE SUPPLY PROVIDING IMPROVED POWER EFFICIENCY DURING ACTIVE MODE OF MEMORY OPERATION

TECHNICAL FIELD

The present invention relates to a memory device, and more particularly to a memory device capable of reducing power consumption during an active mode of operation.

BACKGROUND ART

Conventionally, a memory device receives a power supply voltage VEXT and a ground voltage VSS from outside and generates an internal voltage of various types required for operating various parts of the internal circuit.

Various types of internal voltages include a core voltage, a peripheral voltage, and a high power voltage. A core voltage is supplied to a core region of the memory device, that is, a memory cell array. A peripheral voltage is supplied to a peripheral circuit of the core region, that is, the circuit arranged outside the memory cell array and for connection with the memory cell array. A high voltage is used for driving a word line and the others similar.

Figure 1:
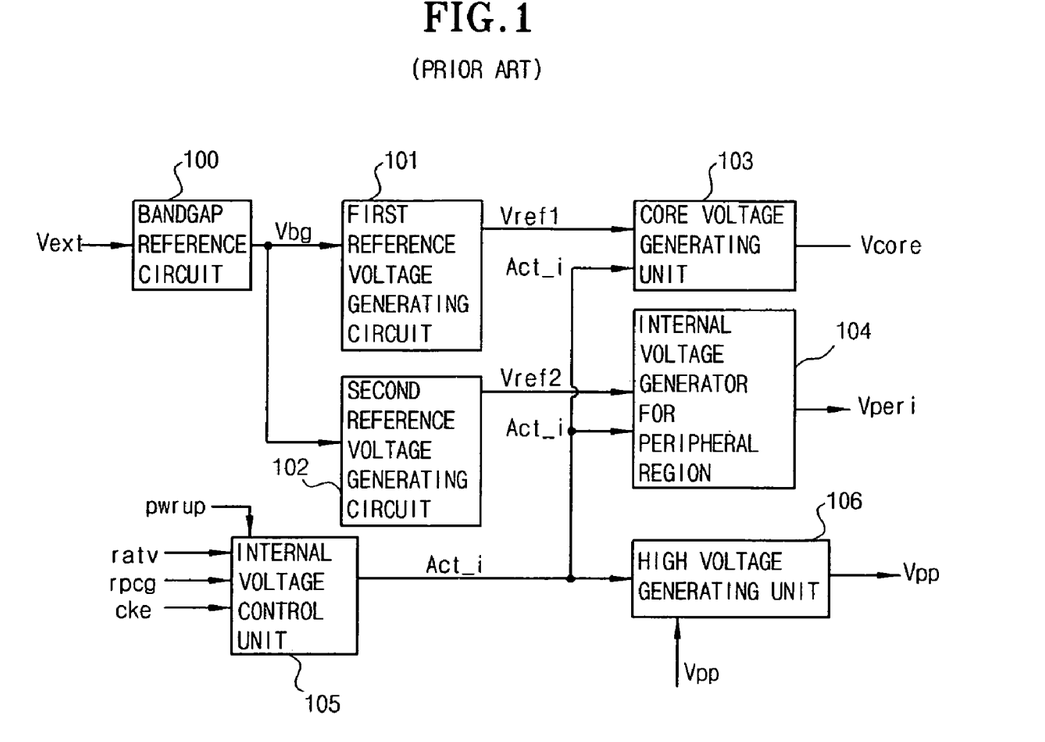
FIG. 1 is a block diagram showing an example of a conventional internal voltage generator used for internal operations of a memory device according to prior art.

FIG. 1 shows an example of the conventional internal voltage generator used in a memory device.

In FIG. 1, a bandgap reference circuit 100 (well known by those skilled in the pertinent art) receives an external voltage VEXT and outputs a bandgap reference voltage Vbg.

A first reference voltage generating circuit 101 receives the bandgap reference voltage Vbg and outputs a first reference voltage Vref1 having a voltage level. A second reference voltage generating circuit 102 receives the bandgap reference voltage Vbg and outputs a second reference voltage Vref2 also having a voltage level.

A core voltage generating unit 103 receives the first reference voltage Vref1 and outputs a core voltage Vcore for use in the core region of the memory device.

An internal voltage generator for peripheral region 104 receives the second reference voltage Vref2 and outputs a peripheral voltage Vperi for use in the peripheral circuit.

A high voltage generating unit 106 equipped with a high voltage pumping unit detects the voltage level of a high voltage Vpp applied to the word line and then outputs a stable high voltage.

An internal voltage control unit 105 receives a plurality of signals pwr_up, rpcg, ratv, and cke to output a control signal act_i. As shown in FIG. 1, the control signal act_i controls the operations of the core voltage generating unit 103, the internal voltage generator for peripheral region 104, and the high voltage generating unit 106.

Figure 2:
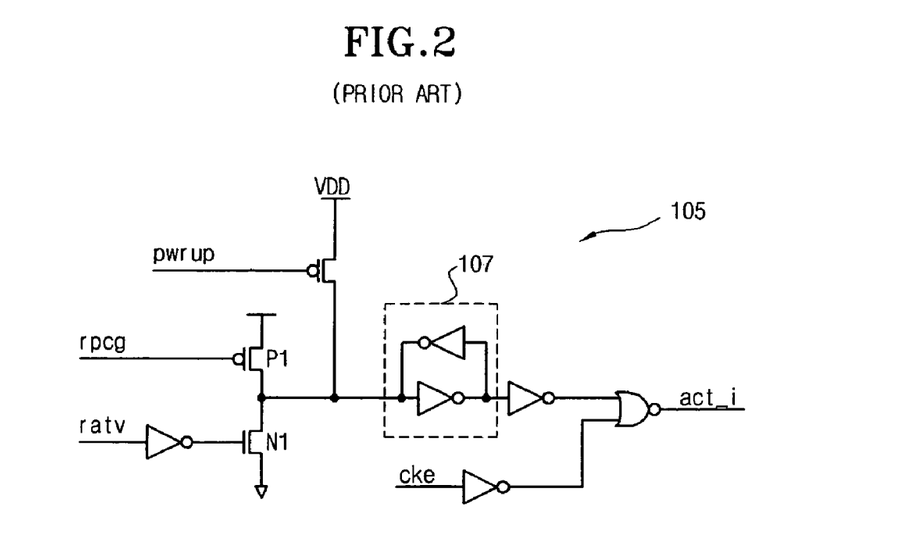
FIG. 2 is a circuit diagram showing an example of the conventional internal voltage controller 105 as shown in FIG. 1.

FIG. 2 is a circuit diagram of the internal voltage control unit 105 shown in FIG. 1.

The signals pwrup, rpcg, ratv as shown in FIGS. 1-2 are defined as follows:

(1) The signal pwrup is a power up signal indicating that the external voltage VEXT is applied;

(2) The signal rpcg is a signal enabled if the memory device enters into a precharge mode;

(3) The signal ratv is a signal enabled if the memory device enters into an active mode; and (4) The signal cke is a clock enable signal used in a synchronous memory device.

Referring to FIGS. 1-2, the signal pwrup is in a low level until the external voltage VEXT reaches a stable level. The power up signal pwrup then is in a high level after the external voltage VEXT reaches the stable level.

Figure 3:
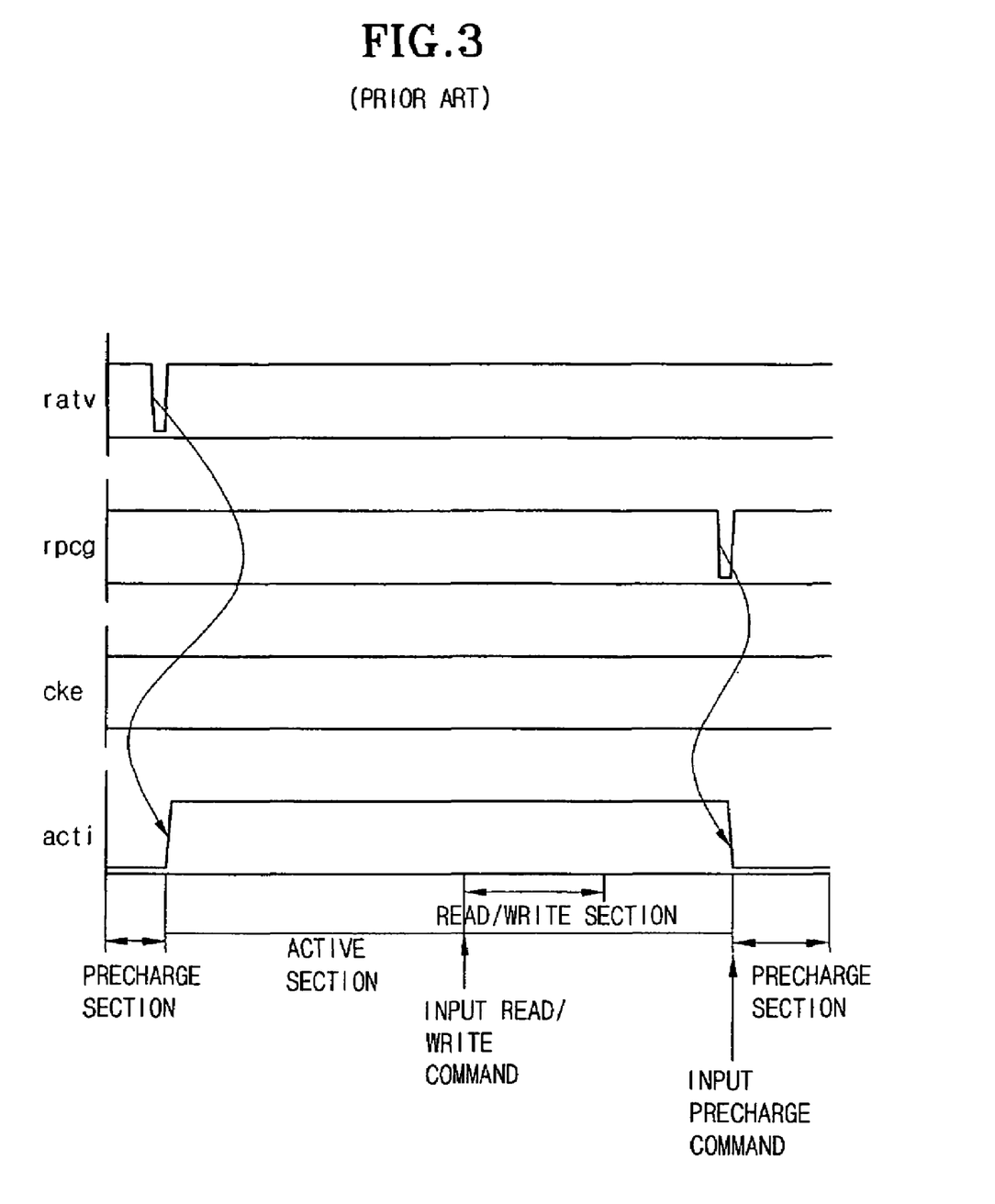
FIG. 3 is a signal pulse diagram of the conventional circuit shown in FIG. 2.

The signal ratv generates a low pulse when the memory device enters into the active mode. FIG. 3 shows the low pulse signal ratv.

The signal rpcg generates the low pulse to exit the active mode and enter into the precharge mode. FIG. 3 shows the low pulse signal rpcg.

The signal cke remains high level while the memory device is operating and transits to the low level when the memory device enters into a power down mode.

FIG. 3 is a signal pulse diagram of the circuit shown in FIG. 2.

As shown in FIG. 3, the control signal act_i remains high level during two low pulse signals ratv and rpcg. If the low pulse signal ratv is generated by an active command, the signal act_i transits to a high level. The high level signal act_i will then transit to a low level when the signal rpcg of low pulse is generated.

The operations of a conventional memory device having a conventional internal voltage generator are described below referring to FIGS. 1-3.

The bandgap reference circuit 100 receives the external voltage VEXT supplied to the memory device and outputs the bandgap reference voltage Vbg having a predetermined voltage level. Typically, the voltage level of the external voltage VEXT supplied from outside is unstable. The bandgap reference circuit 100 receives such unstable external voltage VEXT and outputs the bandgap reference voltage Vbg that maintains a stable voltage level.

The first reference voltage generating circuit 101 and the second reference voltage generating circuit 102 adjust the bandgap reference voltage Vbg and generate the voltages Vref1 and Vref2, respectively, as a basis for generating the internal voltages Vcore and Vperi, respectively, that are necessary for internal operations of the memory device.

The core voltage generating unit 103 generates the core voltage Vcore used in the core region using the first reference voltage Vref1 when it is enabled by the control signal act_i.

The internal voltage generator for peripheral region 104 generates the peripheral voltage Vperi used in the peripheral circuit using the second reference voltage Vref2 when it is enabled by the control signal act_i.

The high voltage generating unit 106 is also enabled by the control signal act_i and detects the level of the high voltage Vpp and then outputs a high voltage of a certain predetermined level (which could be Vpp) by utilizing the pumping operation. The high voltage Vpp is a voltage used for word line driving, or other similar driving operations in a memory device.

The internal voltage control unit 105 generates the control signal act_i that enables the core voltage generating unit 103, the internal voltage generator for peripheral region 104, and the high voltage generating unit 106.

As shown in FIGS. 2-3, the memory device enters into an active mode when the active signal ratv is applied as a low level pulse, and the memory device enters into a precharge mode when the precharge signal rpcg is inputted as a low level pulse.

Now referring to FIG. 3, the memory device enters into an active section (signaled by the low level pulse ratv) from a precharge section, and, during the active section, the memory device enters into a read/write operation section for performing the corresponding read/write operations if a read/write command is applied, and then enters back into the precharge section if the active section terminates (when signaled by the low level pulse rpcg).

Thus, all of the core voltage generating unit 103, the internal voltage generator for peripheral region 104, and the high voltage generating unit 106 are operated during the entire active section (including the read/write operation section).

However, there could be certain sections in the active section (see FIG. 3 bottom, for example, when act_i is high level) that do not require operating the core voltage generating unit 103, or the internal voltage generator for peripheral region 104, or the high voltage generating unit 106. For example, the time between the beginning of the active section and the input of a read/write command, the core voltage generating unit 103 and the others like such as 104 and 106 may be disabled (possibly after a prescribed time delay after entering into the active mode) without causing operational problems.

However, in the conventional memory devices, the core voltage generating unit 103, the internal voltage generator for peripheral region 104, and the high voltage generating unit 106 are operated continuously during the active mode, which causes unnecessary power consumption.

SUMMARY OF THE INVENTION

The present invention has been developed in order to solve the above and other problems associated with the related art. A feature of the present invention is to provide a memory device capable of reducing current consumed in the active mode.

To this end, the present invention provides a memory device for interrupting operations of a core voltage generating unit, an internal voltage generator for peripheral region, and a high voltage generating unit, if a prescribed time elapses after applying an active command.

Further, the present invention provides a memory device for enabling a core voltage generating unit, an internal voltage generator for peripheral region, and a high voltage generating unit to be operated at a point of time when a read/write command is applied.

In accordance with a first embodiment of the present invention, there is provided a memory device comprising a first internal voltage generator which continues to output a first voltage while the memory device is operating; and a second internal voltage generator which outputs the first voltage selectively in accordance with operational modes of the memory device.

In accordance with a second embodiment of the present invention, there is provided a memory device comprising a first internal voltage generator which continues to output a first voltage while the memory device is operating; and a second internal voltage generator which outputs the first voltage independently if the memory device enters into an active mode.

In the second embodiment, the second internal voltage generator is disabled not to output the first voltage if a first time elapses after entering into the active mode 4. Herein, the second internal voltage generator outputs the first voltage while performing a read/write operation if a read/write command is applied at a point of time when a second time elapses after the second internal voltage generator is disabled.

The memory device according to the second embodiment of the present invention further comprises a third internal voltage generator which outputs the first voltage independently from a point of time when the memory device enters into the active mode until the memory device completes precharge operation.

BRIEF DESCRIPTION OF THE DRAWINGS

The present invention will be apparent from a reading of the following detailed description and a review of the associated drawings, in which.

DETAILED DESCRIPTION

Embodiments of the present invention are described in detail with reference to the accompanying drawings.

Figure 4:
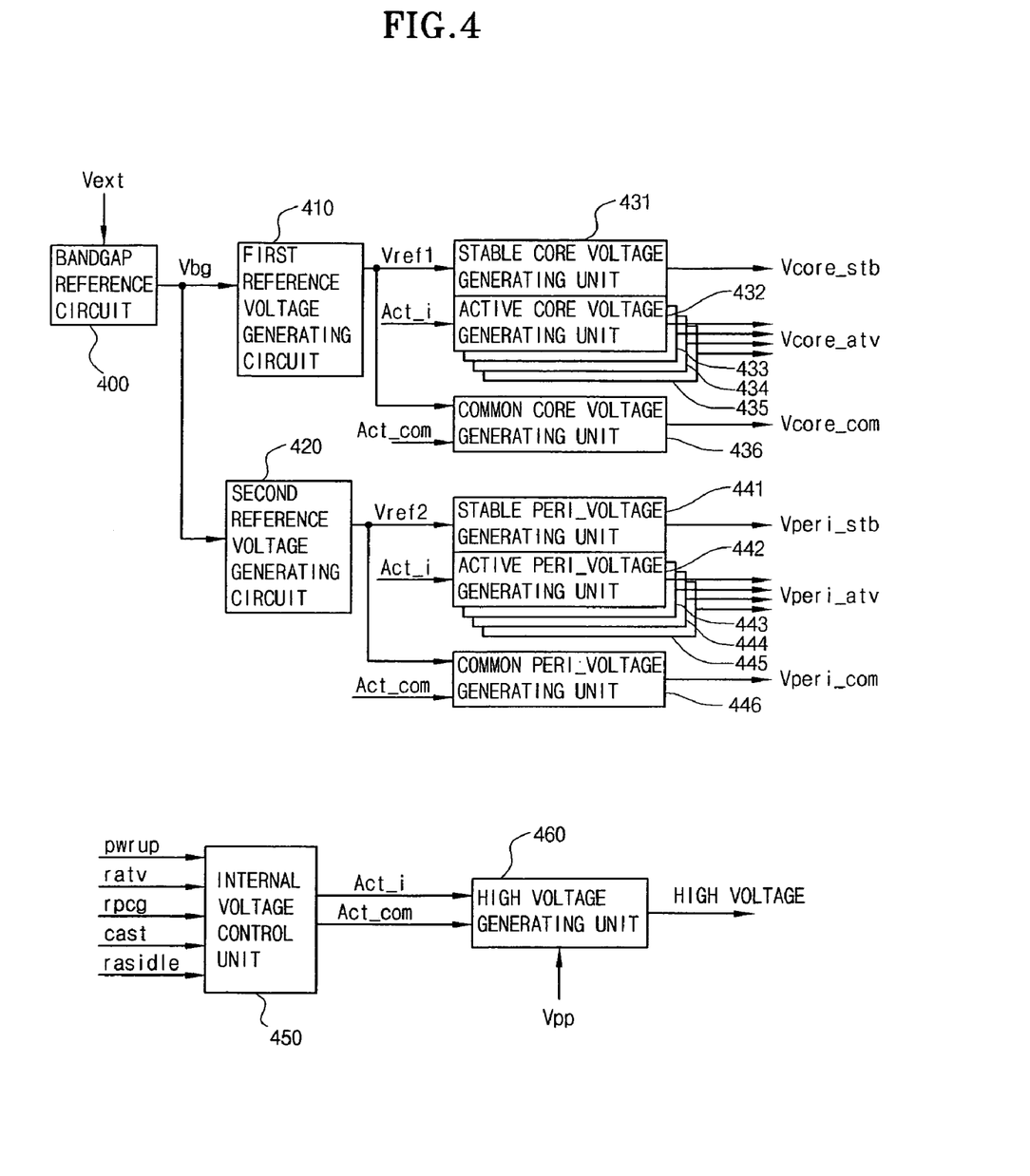
FIG. 4 is a block diagram illustrating an example of an internal voltage generator used for internal operation of the memory device according to an embodiment of the present invention.

FIG. 4 is a block diagram showing an example of an internal voltage generator used for internal operations of a memory device according to an embodiment of the present invention.

In FIG. 4, the bandgap reference circuit 400 (well known by those skilled in the pertinent art) receives an external voltage VEXT and outputs a bandgap reference voltage Vbg.

A first reference voltage generating circuit 410 receives the bandgap reference voltage Vbg and outputs a first reference voltage Vref1 having a predetermined voltage level. A second reference voltage generating circuit 420 receives the bandgap reference voltage Vbg and outputs a second reference voltage Vref2 having a predetermined voltage level.

A set of core voltage generating units 431-436 receive the first reference voltage Vref1 to generate core voltage signals Vcore_stb, Vcore_atv, and Vcore_com (collectively referred to as Vcore) used in the core region of a memory device. The core voltage generating unit 431 generates the core voltage Vcore_stb that always turns on if the memory device is operating. Each of the core voltage generating units 432-435 generates a core voltage Vcore_atv depending on the high level state of the control signal Act_i (where i is one of 0, 1, 2, 3 according to this embodiment). The core voltage generating unit 436 generates the core voltage Vcore_com if a control signal Act_com of high level is applied. The reason for having multiple core voltage generating units 431-436 is to effectively and yet selectively provide the stable core voltage in accordance with the operation circumstance of the memory device as more on this described below in detail.

Each of the core voltage generating units 432-435 corresponds one-to-one to each bank of the memory device (the number of banks in a memory device is variable although the total number of banks is assumed to be 4 in this embodiment of the present invention). Therefore, for example, the core voltage generating unit 432 is enabled if the control signal Act_0 is enabled high level; the core voltage generating unit 433 is enabled if the control signal Act_1 is enabled high level; the core voltage generating unit 434 is enabled if the control signal Act_2 is enabled high level; and the core voltage generating unit 435 is enabled if the control signal Act_3 is enabled high level. On the other way, the core voltage generating units 431, 436 provide the core voltages Vcore_stb and Vcore_com commonly to all 4 banks of this embodiment. That is, the 4 banks may share the core voltage generating units 431, 436.

Figure 7:
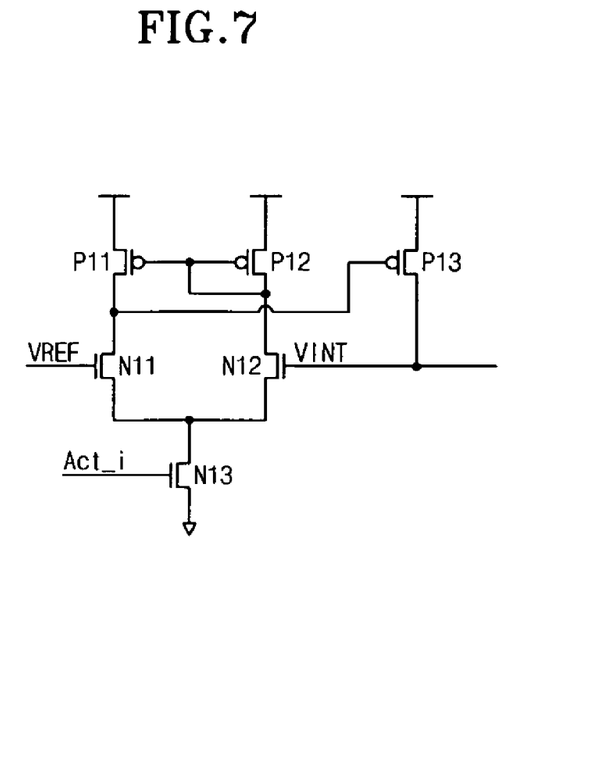
FIGS. 7-8 are circuit diagrams showing a core voltage generating unit and an internal voltage generator for peripheral region that are enabled or disabled by a control signals Act_i and Act_com, respectively, according to an embodiment of the present invention.

An example for each of the active core voltage generating units 432-435 is shown in FIG. 7. An example of the common core voltage generating unit 436 is shown in FIG. 8.

The structure of the statble core voltage generating unit 431 (which remains enabled while the memory device is operating as described above) is same as the circuit structure of FIG. 7, except that the transistor receiving the control signal Act_i is always turns on.

Figure 8:
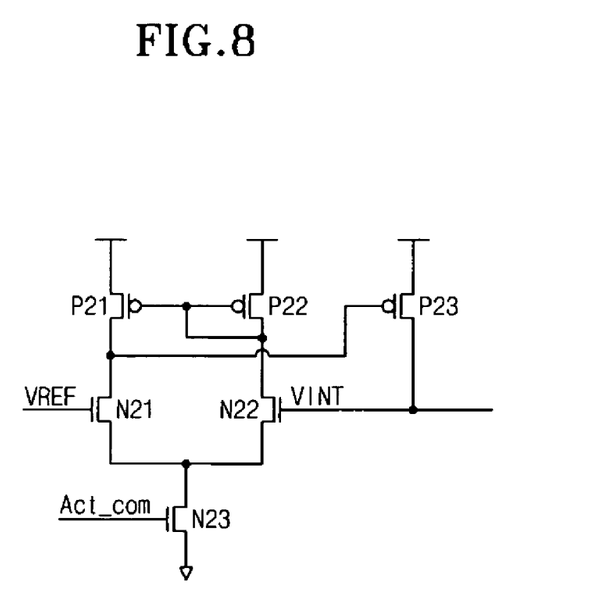

The output voltage VINT in FIGS. 7-8 refers to the corresponding core voltage outputted by each of the units 431-436.

Then, the internal voltage generator for peripheral region 441 receives the second reference voltage Vref2 to generate a peripheral voltage Vperi used in the peripheral circuit.

The internal voltage generators for peripheral region 441-446 receive the second reference voltage Vref2 and generate a peripheral voltage Vperi_stb, Vperi_atv, Vperi_com (collectively referred to as Vperi) used in the peripheral region of the memory device. The internal voltage generator for peripheral region 441 (i.e., the stable peri-voltage generating unit) generates the peripheral voltage Vperi that always turn on while the memory device is operating. Each of the core voltage generating units 441-445 generates the peripheral voltage Vperi_atv depending on the high level signal of Act_i (where i although variable according to the number of memory banks is one of 0, 1, 2, 3 in this embodiment) is applied. The core voltage generating unit 446 generates the peripheral voltage Vperi_com when the control signal Act_com of high level is applied. The reason for having multiple the internal voltage generators for peripheral region is that it effectively and yet selectively provides the stable peripheral voltage in accordance with the operational circumstances of the memory device as more on this described in detail below.

Each of the internal voltage generators for peripheral region 442-445 (i.e., the active peri_voltage generating units) corresponds one-to-one to each bank of the memory device where the number of memory bank is assumed to be 4 in this embodiment. Thus, the internal voltage generator for peripheral region 442 is enabled if the control signal Act_0 is enabled high level; the internal voltage generator for peripheral region 443 is enabled if the control signal Act_1 is enabled high level; the internal voltage generator for peripheral region 444 is enabled if the control signal Act_2 is enabled high level; and the internal voltage generator for peripheral region 445 is enabled if the control signal Act_3 is enabled high level. On the other way, the internal voltage generators for peripheral region 441, 446 provide the Vperi_stb and Vperi_com voltages commonly to all 4 banks. That is, the 4 banks may share the peripheral voltage generating units 441, 446.

The circuit for each of the internal voltage generators for peripheral region 442-445 is substantially same as the circuit structure shown in FIG. 7. The circuit for the internal voltage generator for peripheral region 446 is substantially same as the circuit structure of FIG. 8.

The internal voltage generator for peripheral region 441 remains enabled while the memory device is operating, as described above.

Next, the internal voltage control unit 450 receives a plurality of signals pwrup, rpcg, ratv, cast, and rasidle to output the control signals Act_i and Act_com. As described above, operations of the core voltage generating units 432-435 and the internal voltage generators for peripheral region 442-445 are controlled by the control signals Act_i and Act_com.

Lastly, the high voltage generating unit 460 is controlled by the control signal Act_com for applying the high voltage to the word line when the active command is applied.

Figure 5A:
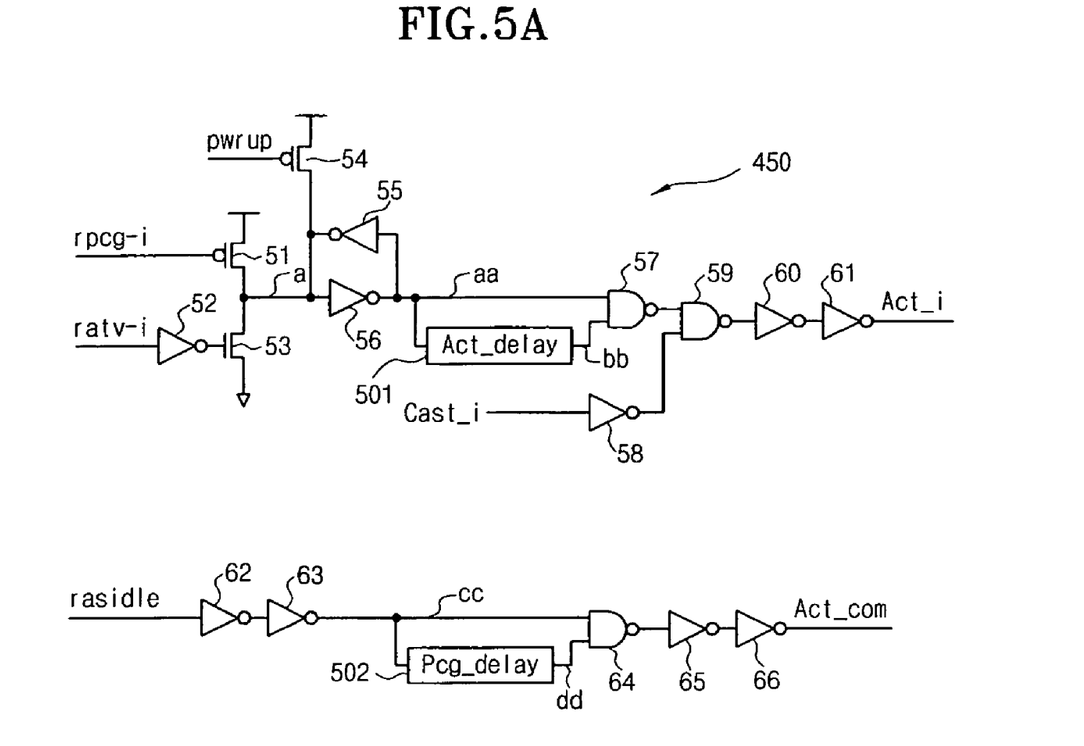
FIG. 5A is a circuit diagram showing an example of the internal voltage controller 450 shown in FIG. 4.
Figure 5B:
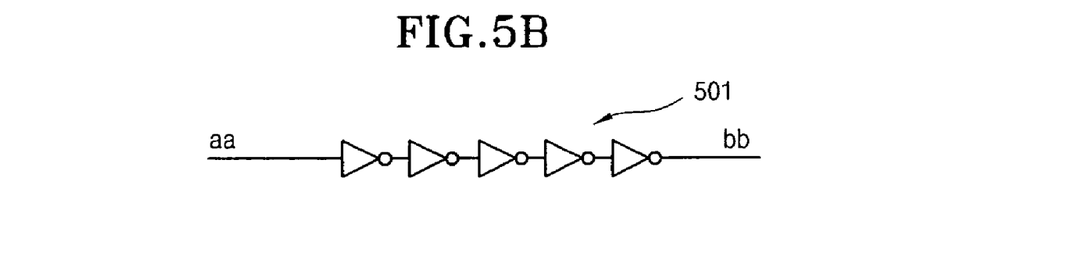
FIG. 5B is a circuit diagram illustrating an example of a delay unit 501 of FIG. 5A.
Figure 5C:
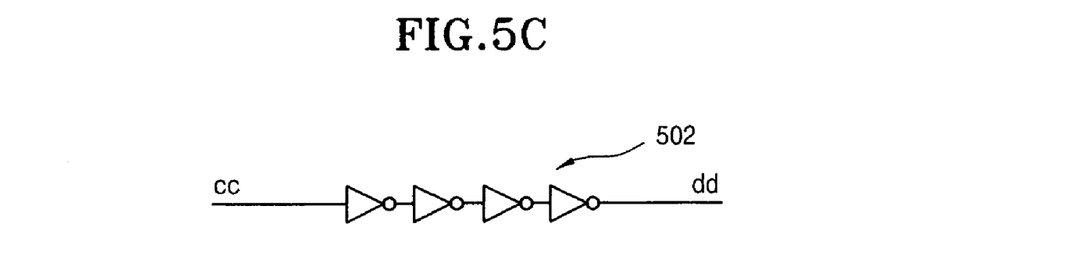
FIG. 5C is a circuit diagram illustrating an example of a delay unit 502 of FIG. 5A.

FIG. 5A is a circuit diagram showing an internal voltage controller 450 of FIG. 4 according to an embodiment of the present invention. FIG. 5B is a circuit diagram of the delay unit 501 of FIG. 5A, and FIG. 5C is a circuit diagram of the delay unit 502 of FIG. 5A according to an embodiment of the present invention.

As shown in FIG. 5A, the circuit of the internal voltage control unit shown includes:

(1) a PMOS transistor 51 connected between a power supply voltage and a node 'a';

(2) a NMOS transistor 53 connected between the node 'a' and the ground;

(3) an inverter 52 for receiving the signal ratv_I, the output of which is connected to the gate of the NMOS transistor 53;

(4) a PMOS transistor 54 connected between the power supply voltage and the node 'a';

(5) latches 55, 56 connected between the node 'a' and the node 'aa';

(6) a delay unit 501 connected between a node 'aa' and a node 'bb';

(7) a NAND gate 57 with one input terminal connected to the node 'aa' and another input terminal connected to the node 'bb';

(8) an inverter 58 for receiving the signal cast_i;

(9) a NAND gate 59 for receiving output signals from the NAND gate 57 and the inverter 58; and (10) buffers 60, 61 serially connected to the output terminal of the NAND gate 59 and outputting the Act_i signal.

The power up signal pwrup is applied to the gate of the PMOS transistor 54; the precharge signal rpcg_i is applied to the gate of the PMOS transistor 51; the output signal of the inverter 52 is applied to the gate of the NMOS transistor 53; and the output signal of the buffers 60, 61 is the "Act_i".

Further, the internal voltage control unit 450 includes:

(1) buffers 62, 63 that are serially connected for receiving a signal rasidle to output it to a node 'cc';

(2) a delay unit 502 located between the node 'cc' and the node 'dd';

(3) a NAND gate 64 for receiving signal on the node 'cc' and signal on the node 'dd'; and (4) buffers 65, 66 that are serially connected for receiving output signal from the NAND gate 64. Here, the signal outputted from the buffers 65, 66 is the "Act_com".

FIG. 5B shows an example of the delay unit 501, which is constructed of an odd number of inverters, and FIG. 5C shows an example of the delay unit 502, which is constructed of an even number of inverters.

In FIG. 5A, the signal pwrup is a power up signal indicating that the external voltage VEXT is applied; the signal rpcg_i is enabled if the memory device enters into the precharge mode; the signal ratv_i is enabled if the memory device enters into the active mode; the signal rasidle is a signal externally applied to the memory device and has a low level in an active mode and a high level in a precharge mode. The rasidle signal transits from a low level to a high level when the precharge command is applied, and thereafter the rasidle signal transits from a high level to a low level when the active command is applied; and the signal cast_i remains high level during a read/write operation conforming to a read/write command.

The variable i in this embodiment denotes, for example, one of 0, 1, 2, and 3 (the total number of which would vary depending on the number of memory banks). Thus, the signal rpcg_1 would refer to the rpcg signal applied to the bank 1. The power up signal pwrup is a low level before the external voltage VEXT reaches a stable level, and the pwrup signal reaches a high level after the external voltage VEXT reaches the stable level Shown in FIG. 6 is a pulse diagram of input and output signals for illustrating the operations of the internal voltage control unit shown in FIGS. 5A-5C.

Now referring to FIG. 5A, when the power up signal pwrup is a low level (indicating that the externally applied power supply voltage VEXT is not yet stable), the node 'a' becomes a high level and the node 'aa' becomes a low level during the early stage when the power supply voltage VEXT is applied. When the power supply voltage VEXT is stabilized, the power up signal pwrup becomes a high level turning off the PMOS transistor. Thereafter, the voltage level of the node 'aa' remains a low level by the latches 55, 56. The voltage level of the node 'aa' is shown in FIG. 6. As a result, the control signal Act_i remains a low level when the node 'aa' is in a low voltage level.

Figure 6:
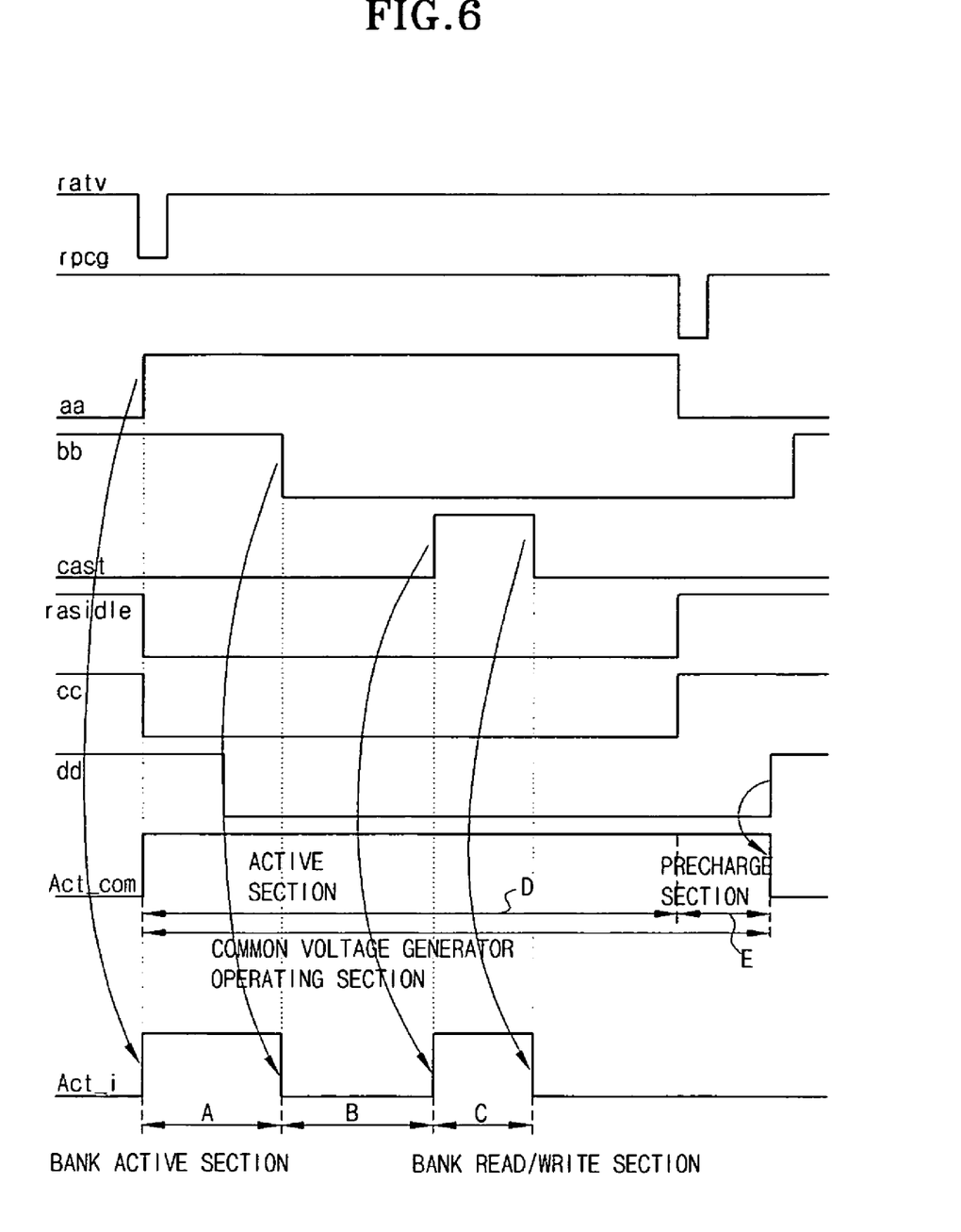
FIG. 6 is a pulse diagram of various input and output signals of the internal voltage control unit shown in FIG. 5A.

Next, in presence of an active command, the internal signal ratv_i recognizes the active command by outputting a low pulse as shown in FIG. 6. Then, the NMOS transistor 53 would turn off, and the node 'a' would become a low level. As a result, the node 'aa' would then transit to a high level. The node 'bb' transits to low level after a prescribed time delay due to influence of the delay unit 501 (see FIGS. 5B and 6). Therefore, as shown in FIG. 6, the control signal Act_i is synchronized to a rising edge of the node 'aa' voltage signal when transiting from a low level to a high level and synchronized to a falling edge of the node 'bb' when transiting from a high level to a low level. This is shown in FIG. 6, Act_i, section A.

The control signal Act_i controlling the core voltage and peripheral voltage generating units 431-436, 441-446 is disabled when a prescribed time is elapsed after applying the active command by controlling the delay time through the delay unit 501. This period of time in which the Act_i is disabled is shown as Act_i, section B, in FIG. 6.

After the applying the active command, the read/write command can be applied as shown in FIG. 6, Act_i, section C. When the read/write command is applied, corresponding internal signal cast_i is also enabled at a high level and remains at the high level while the read/write operation is performed.

Referring to FIG. 5A, if the internal signal cast_i becomes a high level, the output signal of the inverter 58 is a low level. Therefore, the control signal Act_i becomes a high level again, and the control signal Act_i remains high level while the internal signal cast_i remains at a high level. This is shown in FIG. 6, Act_i, section c.

As readily understood from the above, (1) the control signal Act_i remains at a high level for a predetermined time after applying the active command (section A), and (2) the control signal Act_i transits back to a low level for a predetermined time until the read/write command is applied (FIG. 6, Act_i, section B). Therefore, during the section B, the core and peripheral voltage generating units controlled by the control signal Act_i are interrupted from operation, and this will lower the power consumption.

Regarding the rasidle signal, the signal rasidle transits to a low level when the active command is applied or transits to a high level when the precharge command is applied. If the signal rasidle transits to a low level in response to the active command, the node 'cc' (referring to FIG. 5A) becomes a low level, and the NAND gate 64 in turn transits to a high level. As a result, the output signal Act_com of the buffers 65, 66 transits to a high level. This is shown in FIG. 6, Act_i, section D.

Next, if the signal rasidle transits to a high level when the precharge command is applied, the node 'cc' transits to a high level, but the node 'dd' will transit to a high level after a certain time delay as shown in FIGS. 5A and 5C. When the nodes 'cc' and 'dd' become a high level, the NAND gate 64 then transits to a low level, and thus the signal Act_com in turn transits to a low level. Consequently, it can be appreciated from FIG. 6, section E, that the signal Act_com transits to low level if a delay time of the delay unit 502 elapses after applying the precharge command.

The core voltage generating unit 436 and the internal voltage generator for peripheral region 446 of FIG. 4 which receive the control signal Act_com may operate only while the control signal Act_com remains high level. Therefore, it can be understood that the core voltage generating unit 436 and the internal voltage generator for peripheral region 446 of FIG. 4 operate only during the active section D and the precharge section E.

In this regard, the core voltage generating unit 431 and the internal voltage generator for peripheral region 441 are always enabled while the memory device is operating in order to provide the core voltage and the peripheral voltage respectively.

The core voltage generating units 432-435 and the internal voltage generators for peripheral region 442-445 are selectively enabled/disabled in the active section, thereby reducing the power consumption. Subsequently, it is possible to provide the core voltage stably in the active operation or the read/write operation.

Further, the core voltage generating unit 436 and the internal voltage generator for peripheral region 446 are enabled during the active section and the precharge section, and are particularly responsible for stabilizing the core voltage supplied during the precharge section.

FIGS. 7-8 are examples of the core voltage generating unit and the internal voltage generator for peripheral region which are enabled or disabled respectively by the control signal Act_i, Act_com according to the present invention.

As can be known, it is possible to reduce the power consumption by controlling operation sections of the core voltage generating unit and the internal voltage generator for peripheral region during the active operation.

The foregoing embodiment and advantages are merely exemplary and are not to be construed as limiting the present invention. The present teaching can be readily applied to other types of embodiments. Also, the description of the embodiments of the present invention is intended to be illustrative, and not to limit the scope of the claims, and many alternatives, modifications, variations will be apparent those skilled in the art.

What is claimed is:

1. A internal voltage generator in a semiconductor memory device comprising:
    a first internal voltage generator receiving an internal reference voltage and outputting a first signal having a first voltage level to internal circuits of the memory device during an active mode of the memory device operation;
    a second internal voltage generator receiving the internal reference voltage and outputting a second signal having a second voltage level to the internal circuits of the memory device, wherein the second signal is interrupted in absence of a predetermined level of a power control signal during the active mode of the memory device operation, such that the second internal voltage generator is selectively enabled/disabled during the active mode; and
    an internal voltage control unit monitoring a plurality operational signals generated by the memory device and outputting the predetermined level of the power control signal during a plurality of active sections of the active mode of the memory device operation requiring power.

2. The internal voltage generator of claim 1, wherein the plurality of operational signals monitored by the internal voltage control unit comprises:
    a power up signal indicating that an external voltage is applied to the memory device;
    a rpcg signal indicating a precharge mode status of the memory device;
    a ratv signal indicating an active mode status of the memory device;
    a cast signal indicating a read/write status of the memory device; and
    a rasidle signal having a predetermined voltage level depending on the precharge mode or the active mode status of the memory device.

3. The internal voltage generator of claim 2, wherein the plurality of active sections of the active mode of the memory device operation requiring power include: a memory bank active section and a memory bank read or write section.

4. The internal voltage generator of claim 3, wherein the power control singal incating the memory bank active section is rendered to a predetermined level for a predetermined period of time when the ratv signal indicates the active mode of the memory device.

5. The internal voltage generator of claim 4, wherein the first and second signals have substantially equal voltage.

6. The internal voltage generator of claim 3, wherein the the power control signal indicating the bank read or write section is rendered to a predetermined level when the cast signal indicates the read/write status of the memory device.

7. The internal voltage generator of claim 6, wherein the voltage levels of the first and second signals are equal.

8. The internal voltage generator of claim 2, wherein the internal voltage control unit generates common voltage control signal, wherein the common voltage control signal is rendered to a predetermined voltage level during at least the active section of the memory device determined by the time period between the ratv signal indicating the active mode status of the memory device and the rpcg signal indicating the precharge mode status of the memory device.

9. The internal voltage generator of claim 8, wherein the predetermined voltage level of the common voltage control signal is extended for a predetermined period time in addition to the active section of the memory device.

10. The internal voltage generator of claim 9 further comprising:
    a common voltage generating unit receiving the internal reference voltage and outputting a third signal having a third voltage level to the internal circuits of the memory device when the common voltage control signal is rendered to the predetermined voltage level.

11. The internal voltage generator circuit of claim 9 further comprising;
    a high voltage generating unit receiving at least the power control signal and the common voltage control signal and outputting a high voltage for driving a word line based on the signal levels of the power control signal and the common voltage control signal.

12. The internal voltage generator of claim 1 further comprising:
    a band gap reference circuit receiving an external voltage applied to the memory device and outputting a band gap reference voltage, which is more stable than the external voltage.

13. The internal voltage generator of claim 12 further comprising:
    a reference voltage generating unit receiving the band gap reference voltage and outputting the internal reference voltage.

* * * * *